United States Patent [19]

Devendorf

[11] 3,951,490

[45] Apr. 20, 1976

[54] CABLE SYSTEM DISTRIBUTION SUBSTATION WITH NOVEL CENTER CONDUCTOR SEIZURE APPARATUS

[75] Inventor: Alan E. Devendorf, Phoenix, N.Y.

[73] Assignee: The Magnavox Company, Fort Wayne, Ind.

[22] Filed: Jan. 24, 1974

[21] Appl. No.: 436,251

[52] U.S. Cl. .......................... 339/17 C; 339/122 R; 339/272 A; 317/99; 317/118; 317/120; 174/52 R; 174/59

[51] Int. Cl.² .................... H05K 1/08; H01R 13/46; H01R 13/60

[58] Field of Search ............ 339/17 R, 17 C, 122 R, 339/122 F, 193 R, 193 P, 272 R, 272 A, 272 AU; 174/52 R, 59; 317/99, 118, 120; 333/6, 9, 10, 11, 24 R, 27, 84 M, 97

[56] References Cited

UNITED STATES PATENTS

| | | | |
|---|---|---|---|
| 3,154,364 | 10/1964 | Gerg | 339/272 R X |
| 3,440,329 | 4/1969 | Winston | 174/52 R |
| 3,486,135 | 12/1969 | Sweeney | 317/99 X |
| 3,523,268 | 8/1970 | Foster | 339/193 P X |
| 3,564,486 | 2/1971 | Price | 339/272 A X |
| 3,617,811 | 11/1971 | McVoy | 174/59 X |
| 3,641,464 | 2/1972 | Crowhurst et al. | 333/10 |
| 3,716,651 | 2/1973 | Werner | 339/122 X |

*Primary Examiner*—Joseph H. McGlynn
*Assistant Examiner*—Craig R. Feinberg
*Attorney, Agent, or Firm*—Thomas A. Briody; William J. Streeter; Joe E. Barbee

[57] ABSTRACT

A substation for distributing signals of a cable system. The substation is provided with a novel center conductor seizure apparatus which permits the tension of the center conductor of a cable to be distributed to the frame of the substation. The method of coupling the cable to the substation permits the convenient exchange of associated electronics on a circuit board. The replacement of the circuit board can be accomplished without disconnecting the center conductor.

10 Claims, 6 Drawing Figures

CABLE SYSTEM DISTRIBUTION SUBSTATION WITH NOVEL CENTER CONDUCTOR SEIZURE APPARATUS

BACKGROUND OF THE INVENTION

1. Field of the Invention

This invention relates generally to substations distributing electrical signals in cable systems and more particularly to the coupling of a cable to the substation.

2. Description of the Prior Art

In the prior art, the center conductor of the cable of a system distributing electrical signals had been coupled mechanically to a circuit board. The mechanical coupling of the center conductor cable to the circuit board frequently resulted in destructive mechanical forces being applied to the circuit board. In addition, the mechanical coupling to the circuit board made exchange of the circuit board difficult.

Even when the center conductor of the cable was not directly coupled to the circuit board, the force exerted by this center conductor can impose severe limitations on the element of the distribution substation to which the center conductor could be coupled.

It is therefore an object of the present invention to provide an improved cable distribution system substation.

It is a further object of the present invention to provide an improved method of coupling a cable to an assembly.

It is a more particular object of the present invention to provide an improved method of coupling the center conductor of a cable to an apparatus.

It is still another object of the present invention to provide an improved center cable conductor seizure which distributes the force of the center conductor through the assembly frame.

It is a further object of the present invention to provide a center conductor seizure which permits an electronic circuit, coupled electrically to a cable center conductor, to be removed without uncoupling the center conductor.

It is a more particular object of the present invention to provide a method of engaging the center conductor of a cable so that the force exerted by the cable is distributed to an apparatus housing.

It is a still more particular object of the present invention to provide an insulating housing for a conducting terminal, the conducting terminal adapted to engage the center conductor of a cable, the conducting terminal further adapted to couple removably to a spring terminal, and wherein the insulated housing is engaged by structural members of the substation to which the cable is to be coupled.

SUMMARY OF THE INVENTION

The aforementioned and other objects of the present invention are accomplished by providing an insulator casing to be secured by portions of a subassembly housing and wherein a center conductor of a coaxial cable can be coupled through an aperture in the insulator casing to a conducting terminal. The conducting terminal engages a connector located on a printed circuit board. The stress caused by the center conductor is transferred through the conducting terminal and the insulator housing to the subassembly frame.

The printed circuit board is coupled to the conducting terminal through a snap connector and can be removed therefrom. Thus the circuit board can be disengaged from the subassembly without disturbing the coupling of the center conductor of the cable.

These and other features of the invention will be understood upon reading the following description together with the drawings.

DESCRIPTION OF THE PREFERRED EMBODIMENT

Description of the Apparatus

Figure 1:
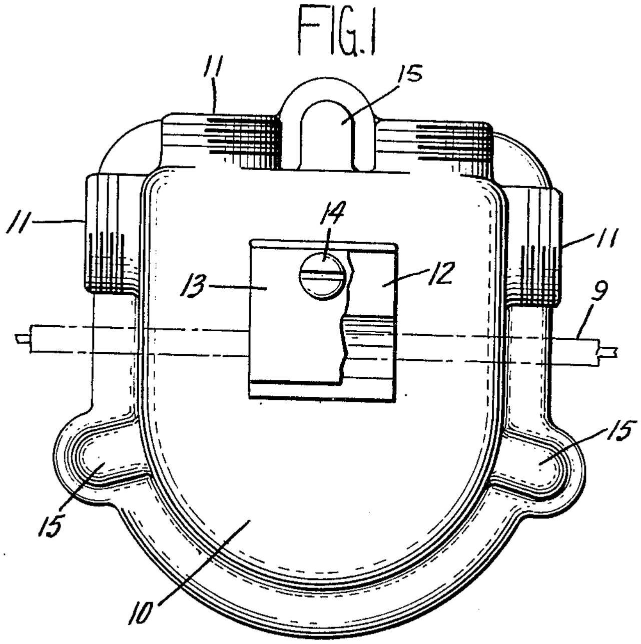
FIG. 1 is a top view of a cable distribution substation.

Referring now to FIG. 1, the top view of a cable distribution substation is shown. The cable distribution housing 10 includes ports 11 for coupling the main cable of the cable distribution assembly to the substation. The external region of ports 11 are threaded to provide a means for coupling a cable outer conductor to the substation. Structures 15 provide a place in the housing into which screws may be extended to couple a base 20 (better seen in FIG. 4) to the housing. Also shown is the structure contained in the housing for coupling the housing 10 to a cable 9. A cable 9 is located in a groove in a projection 12 from housing 10 and the cable is secured in this groove by plate 13 coupled to the housing by screw 14.

Figure 2:
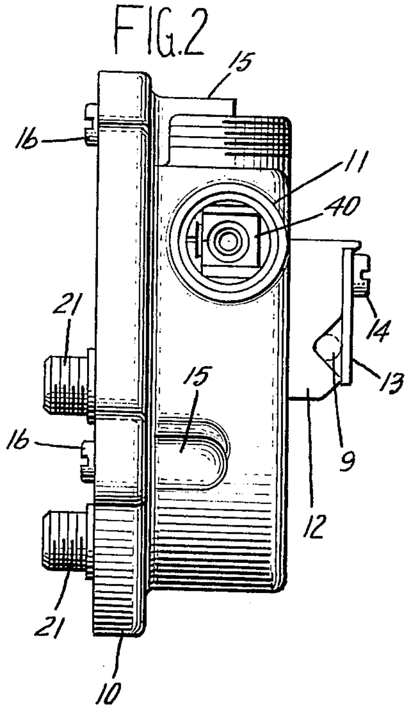
FIG. 2 is a side view of a cable system distribution subsystem.

Referring next to FIG. 2, the side view of the cable distribution substation is shown. Housing projection 12, plate 13, and screw 14 provide a means for securing the substation to a cable 9. Structures 15 provide means for securing screws 16 to the housing 10. The center conductor seizure apparatus 40 is shown inside a port 11.

Figure 3:
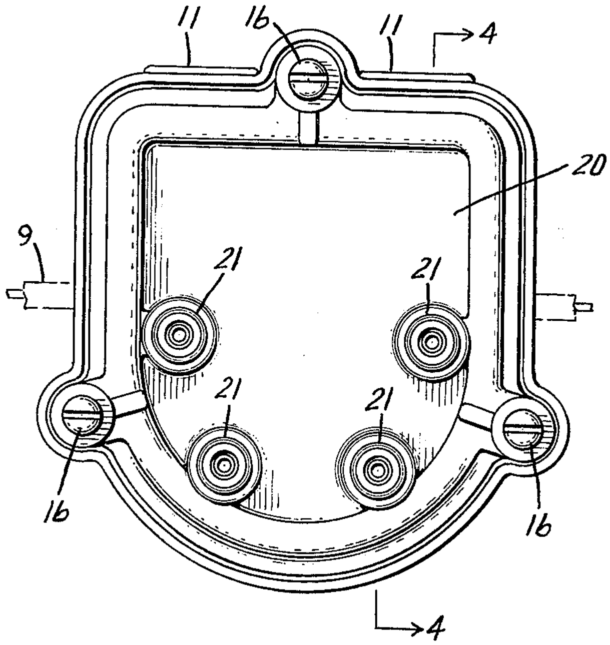
FIG. 3 is a bottom view of the cable system distribution substation.

Referring next to FIG. 3, a bottom view of the cable distribution substation is shown. In this view the base 20 of the substation can be seen. The base contains apertures through which screws 16 extend to couple the base to the housing 10. The coupling ports 11 provide a means for coupling the main cable to the substation. Coupling ports 21 provide a means for coupling cables to the local receivers in the cable distribution system.

Figure 4:
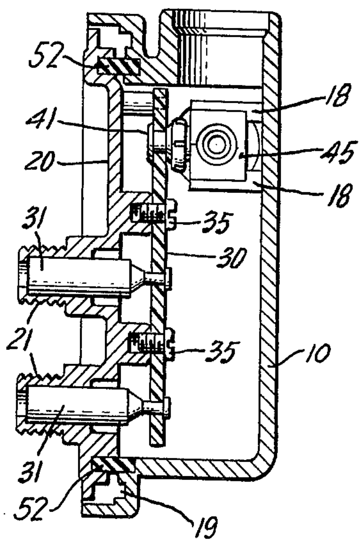
FIG. 4 is a side cross-sectional view of the cable distribution subsystem.

Referring next to FIG. 4, a side cross-sectional view of the cable distribution substation is shown. The cross section of FIG. 4 is indicated by the arrows 4 shown in FIG. 3. In this cross-sectional view, the coupling ports 21 for the local subscribers are shown to contain terminals 31, which in turn, are coupled to circuit board 30. Holes in the circuit board are provided by which screws 35 couple the circuit board to the base 20. Also shown is a snap connector 41 coupled to the circuit board 30. In addition, projections 18 of the housing 10 are shown which engage insulator 45. In the preferred embodiment, the insulator 45 is approximately a cube and the projections 18 are arranged to engage four edges of the cube.

Figure 5:
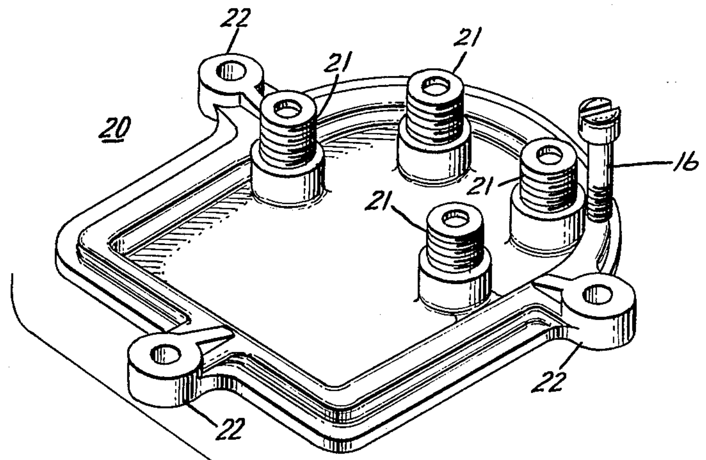
FIG. 5 is an exploded view of the cable distribution substation.
Figure 5:
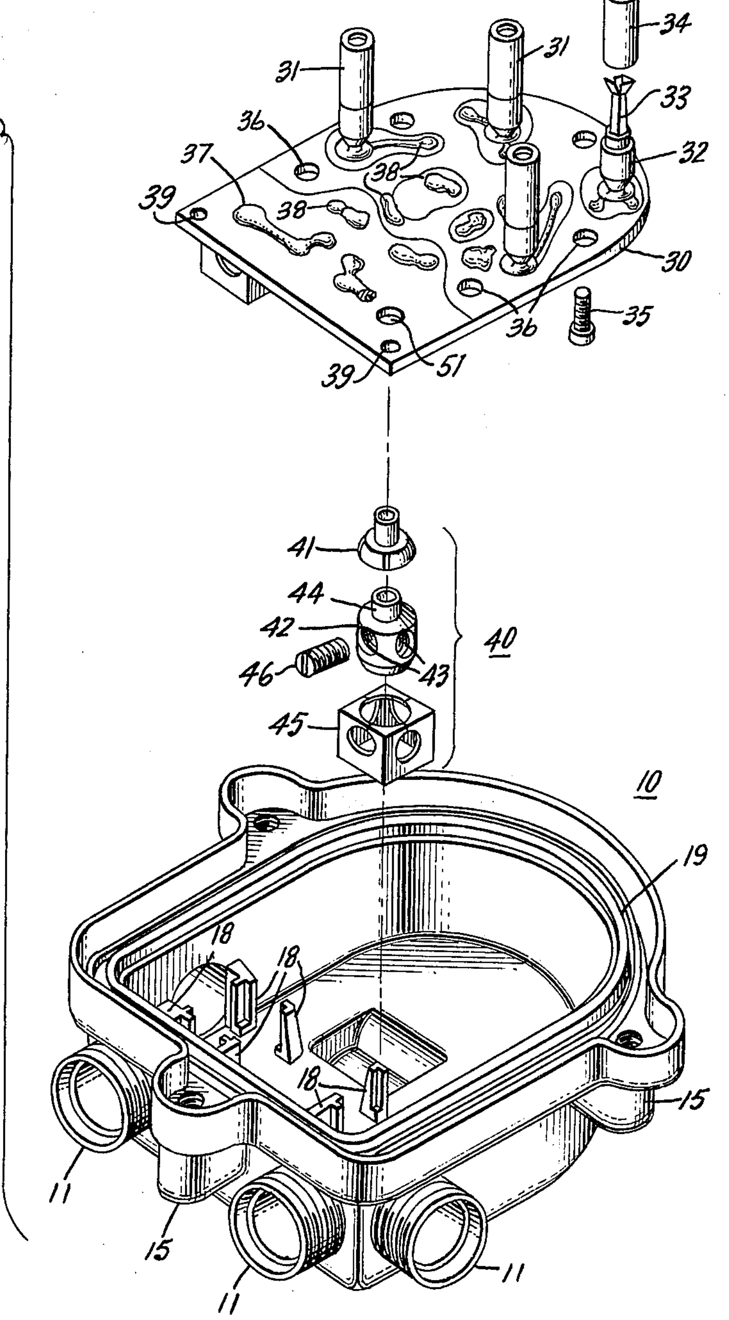

Referring next to FIG. 5, an exploded view of the substation is shown. The base 20 contains structures 22 by which screws 16 secure the base to the housing. The ports 21 engage cables coupled to local receivers. The circuit board 30 has coupled to it a plurality of elements for engaging the center conductor of the cables from the local receivers. Portion 34 of connector 31 is a plastic insulating housing. Terminal 33 provides a spring connector for engaging the center conductor of the local receiver cable which extends into the coupling ports 21. And portion 32 provides additional insulation for the terminal 33 engaging the center conductors of the cables in the local receiver. A plurality of apertures 36 in the circuit board 30 provide the means for screws 35 to couple the circuit board to the base plate 20. On the circuit board 30, a plurality of conducting regions 38 are shown. The position of these conducting regions is determined by the electrical elements located on the reverse side of the circuit board as will be apparent to one skilled in the art. The housing 10 is arranged to provide a sufficient cavity for the electrical elements to project from the circuit board without coming in contact with the housing 10. A snap connector 41 is located in each of apertures 51 to engage a projection 44 of the conducting terminal 42. A snap connector is shown electrically coupled to the circuit board in area 37 channels 39 receive locating projections from base 20. The conducting terminal 42 contains apertures 43 drilled through the terminal. Conducting terminal 42 is fabricated to be located in an insulating housing 45. The insulating housing 45 has openings positioned so that apertures in a conducting terminal are exposed. Insulating housing 45 is adapted to be placed into a region surrounded by projections 18 from base 10. Four apertures 43 of conducting terminal 42 are threaded to permit insertion of a set screw 46. The insulating housing 45 is secured between projections 18 by crimping the top portion in the preferred embodiment; however, other methods of securing this housing arrangement to the housing can be apparent to those skilled in the art. The openings in insulating housing 45 and the apertures 43 in the conducting terminal 42 are arranged to be aligned with the coupling ports 11.

Also shown in FIG. 5 are a plurality of ridges 19 in the housing 10. These ridges are adapted to contain a sealing ring 52 (better seen in FIG. 4) which is compressed between the housing 10 and the base 20. With careful construction of the region housing 10 and base 20, the sealing ring can be eliminated.

Figure 6:
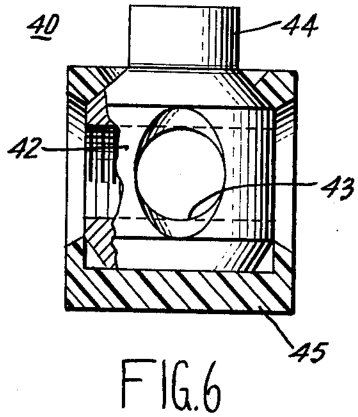
FIG. 6 is a view of the insulator housing and the conducting terminal of the present invention.

Referring now to FIG. 6, an assembled center conductor seizure assembly 40 is shown. The conducting terminal 42 is located in the insulator housing 45. Openings in the housing and apertures in the conducting terminal 42 can be aligned by rotation of the conducting terminal.

Operation of the Preferred Embodiment

Cables carrying signals to be distributed to local receivers coupled to the substation are introduced into the substation through one of a pair of ports 11. The signals are extracted from the substation and transmitted for distribution through other substations through a second series of coupling ports. Incoming signals are electrically coupled to electrical apparatus of the circuit board and are distributed through a plurality of coupling ports 21.

The cable carrying the signals for distribution have the external conductor coupled to the threaded external portion of port 11 by means well known in the art. The center conductors project into the interior of housing 10, extending into the apertures in the conducting terminal 42 which is located in the insulating housing 45. The insulating housing is, in turn, mechanically coupled to the base 20 through the projections 18. When the center conductor is located in the aperture 43 of the conducting terminal 42, a set screw 46 may be introduced into the adjacent port located at right angles to the port containing the cable and secures the center conductor to conducting terminal 42. The coupling port 11 through which the set screw 46 was introduced into the substation can now have a cover placed over it to provide environmental protection. Similarly, the cable coupled to the second set of coupling ports 11 is secured to the housing 10.

The snap connector 41 coupled to the circuit board 30 is positioned such that when the base 20 is coupled to the housing 10, the snap connector engages the projection 44 of the conducting terminal 42. Thus the circuit board 30 is coupled electrically to the printed circuit board and can be easily removed therefrom, while the force of the center conductor is distributed to the housing 10 through the insulator housing 45 and the projections 18. In addition, when the base is removed from the housing 10, the circuit board, which is coupled to the base 20 by means of screws 35, is removed with it. Thus the circuit board 30 can be changed without disturbing the main distribution cable. The substation is secured by the projection 12, plate 13, and screw 14 associated with the housing 10, in the preferred embodiment, although other methods of securing the substation will be readily apparent to those skilled in the art. The base which is coupled to the more manipulatable local receiver cables can be readily removed. Thus the apparatus provides for a convenient exchange of the printed circuit board.

In the preferred embodiment, further shielding of electromagnetic waves can be achieved by positioning the moisture seal gasket 52 into an outer one of ridges 19 and positioning a metal mesh gasket in an inner one of ridges 19. In addition, in the preferred embodiment, a projection of base plate 20 extends into one of ridges 19, providing an erratic path for electromagnetic radiation passing therethrough and achieving further shielding.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A center conductor seizure apparatus for coupling a cable to a distribution box comprising: a terminal, said terminal fabricated of a conducting material; a receptacle, said receptacle fabricated of an insulating material, said receptacle shaped to contain said terminal; a plurality of projections from an electrically conductive housing of said distribution box, said plurality of projections arranged to secure said receptacle whereby any tension exerted by the cable is transmitted to the housing through the plurality of projections; and means for coupling a center conductor of said cable to said terminal; said coupling means having a passage in said terminal; a passage in said receptacle, said receptacle passage and said terminal passage located to receive said center conductor; means for securing said center conductor in said terminal passage; and connecting means for detachably connecting the terminal to a printed circuit board, the connecting means permitting separation of the terminal and printed circuit board without use of any tools.

2. The center conductor seizure apparatus of claim 1 wherein the housing of the distribution box contains apparatus for coupling an outer conductor of said cable to said housing.

3. An electrical substation comprising: a circuit board; a base, said circuit board detachably coupled to said base; a housing, said base detachably coupled to said housing, wherein said circuit board is located between said housing and base, said housing including a set of projections formed as an integral part thereof, said housing including structure for coupling to an outer conductor of a cable; a receptacle fabricated from an insulation material, said receptacle secured by said set of housing projections; a terminal contained by said receptacle; means for coupling a center conductor of a cable having said outer conductor coupled to said housing; and means for detachably coupling said terminal to the circuit board in a manner that eliminates need for any tools to detach said terminal from the circuit board.

4. The substation of claim 3 wherein said center conductor coupling means includes passages in said terminal and said receptacle for receiving said center conductor.

5. The substation of claim 4 wherein said center conductor coupling means further includes a set screw assembly for directly securing said center conductor in said terminal passage.

6. The electrical substation of claim 3 further including: a second receptacle, a second terminal, a second set of projections from said housing, a second center conductor coupling means, and a second means for detachably coupling a second terminal to the circuit board.

7. The electrical substation of claim 3 further including at least one connector for coupling said circuit board to at least one receiver.

8. Apparatus for coupling a cable to an electrical assembly, wherein said electrical assembly includes a housing, comprising: a coupling port in said assembly housing, said coupling port for securing an external conductor of said cable; a plurality of structural members extending from said assembly housing; a casing fabricated from insulating material, said casing attached to said assembly housing by means of said structural members; a terminal in said casing, said terminal located in a predetermined position relative to said coupling port by said structural members; means for coupling a center conductor of said cable to said terminal; means for detachably coupling an electrical circuit to said terminal; said detachable coupling means including a snap connector coupled to said electrical circuit; and a portion of said terminal adapted to receive said snap connector.

9. Apparatus for coupling a cable to an electrical assembly, wherein said electrical assembly includes a housing, comprising:

a coupling port in said assembly housing, said coupling port for securing an external conductor of said cable; a plurality of structural members extending from said assembly housing; a casing fabricated from insulating material, said casing held to said assembly housing by means of said structural members; a terminal in said casing, said terminal located in a predetermined position relative to said coupling port by said structural members; means for coupling a center conductor of said cable to said terminal; means for detachably coupling the terminal to a circuit board in a manner that permits detaching the terminal without the use of any tools; said center conductor coupling means having a first and a second channel in said terminal, said terminal located to engage a center conductor of said cable in said first channel; and a screw for inserting into said second channel, said screw securing said center conductor to said terminal.

10. An electrical substation comprising: a circuit board; a base, said circuit board detachably coupled to said base; a housing, said base detachably coupled to said housing, wherein said circuit board is located between said housing and base, said housing including a set of projections, said housing including structure for coupling to an outer conductor of a cable; a receptacle fabricated from an insulation material, said receptacle secured by said set of housing projections; a terminal contained by said receptacle; means for coupling a center conductor of a cable having said outer conductor coupled to said housing; means for detachably coupling a circuit board to said terminal; said circuit board coupling means includes a snap connector, and said snap connector engaging an exposed portion of said terminal.

* * * * *